US012629792B2

(12) United States Patent
Tateno et al.

(10) Patent No.: US 12,629,792 B2
(45) Date of Patent: May 19, 2026

(54) POLISHING PAD AND METHOD FOR PRODUCING POLISHED PRODUCT

(71) Applicant: FUJIBO HOLDINGS, INC., Tokyo (JP)

(72) Inventors: Teppei Tateno, Ehime (JP); Ryuma Matsuoka, Ehime (JP); Hiroshi Kurihara, Ehime (JP); Satsuki Yamaguchi, Ehime (JP); Yamato Takamizawa, Ehime (JP)

(73) Assignee: FUJIBO HOLDINGS, INC., Tokyo (JP)

( * ) Notice: Subject to any disclaimer, the term of this patent is extended or adjusted under 35 U.S.C. 154(b) by 510 days.

(21) Appl. No.: 18/282,165

(22) PCT Filed: Mar. 22, 2021

(86) PCT No.: PCT/JP2021/011762
§ 371 (c)(1),
(2) Date: Sep. 14, 2023

(87) PCT Pub. No.: WO2022/201254
PCT Pub. Date: Sep. 29, 2022

(65) Prior Publication Data
US 2024/0149389 A1      May 9, 2024

(51) Int. Cl.
*B24B 37/04*      (2012.01)
*C08J 5/18*       (2006.01)
(Continued)

(52) U.S. Cl.
CPC .............. *B24B 37/042* (2013.01); *C08J 5/18* (2013.01); *C08J 9/0061* (2013.01); *C08J 9/18* (2013.01);
(Continued)

(58) Field of Classification Search
CPC ......... B24B 37/20; B24B 37/22; B24B 37/24; B24B 37/26; B24B 37/042; B24D 3/20;
(Continued)

(56) References Cited

U.S. PATENT DOCUMENTS 7,378,454 B2 *   5/2008  Masui .................... C08G 18/10
                                                521/110
12,479,064 B2 *  11/2025  Kawamura ............. B24B 37/22
(Continued)

FOREIGN PATENT DOCUMENTS

CN      1586002 A  *  2/2005  ............. H10P 52/00
EP      1284841 A1     2/2003
(Continued)

OTHER PUBLICATIONS

English translation of CN-1586002-A (Year: 2005).*
(Continued)

*Primary Examiner* — Angela M DiTrani Leff
(74) *Attorney, Agent, or Firm* — Squire Patton Boggs (US) LLP

(57)      ABSTRACT

A polishing pad including a polyurethane sheet as a polishing layer, wherein the polyurethane sheet has a ratio ($E'_{B40}/E'_{T40}$) of a storage elastic modulus $E'_{B40}$ at 40° C. in dynamic viscoelasticity measurement performed under a bending mode condition with a frequency of 1.6 Hz to a storage elastic modulus $E'_{T40}$ at 40° C. in dynamic viscoelasticity measurement performed under a tension mode condition with a frequency of 1.6 Hz of 0.60 to 1.60.

7 Claims, 1 Drawing Sheet

(51) Int. Cl.
*C08J 9/00* (2006.01)
*C08J 9/18* (2006.01)
*H10P 52/40* (2026.01)

(52) U.S. Cl.
CPC ........ *C08J 2203/22* (2013.01); *C08J 2375/08*
(2013.01); *C08J 2433/20* (2013.01); *H10P*
*52/402* (2026.01)

(58) Field of Classification Search
CPC ... B24D 3/22; B24D 3/24; B24D 3/26; B24D
3/28; B24D 3/285; B24D 3/30; B24D
3/32; B24D 3/34; B24D 3/342; B24D
3/344; C08J 5/18; C08J 9/0061; C08J
9/18; C08J 2203/22; C08J 2375/08; C08J
2433/20; H10P 52/402
See application file for complete search history.

(56) References Cited

U.S. PATENT DOCUMENTS

| | | | | |
|---|---|---|---|---|
| 12,496,680 | B2 * | 12/2025 | Tateno | B24B 37/22 |
| 2010/0247839 | A1 | 9/2010 | Hayashida et al. | |

| | | | | |
|---|---|---|---|---|
| 2019/0168356 | A1 * | 6/2019 | Qian | B24B 37/044 |
| 2021/0114166 | A1 * | 4/2021 | Matsuoka | B24B 37/24 |
| 2021/0347006 | A1 | 11/2021 | Matsuoka et al. | |

FOREIGN PATENT DOCUMENTS

| | | | |
|---|---|---|---|
| EP | 1522385 | A2 | 4/2005 |
| JP | 2004-507076 | A | 3/2004 |
| JP | 2005-136400 | A | 5/2005 |
| JP | 2010-230911 | A | 10/2010 |
| JP | 2015-211993 | A | 11/2015 |
| JP | 2019-177430 | A | 10/2019 |
| JP | 2020-055040 | A | 4/2020 |
| JP | 2020-104235 | A | 7/2020 |
| TW | 202022043 | A | 6/2020 |

OTHER PUBLICATIONS

International Search Report mailed May 21, 2021, for International
Application No. PCT/JP2021/011762, with translation, 5 pages.

* cited by examiner

POLISHING PAD AND METHOD FOR PRODUCING POLISHED PRODUCT

CROSS-REFERENCE TO RELATED APPLICATION

This application is a National Stage filing under 35 U.S.C. § 371 of International Patent Application No. PCT/JP2021/011762, filed Mar. 22, 2021, the content of which is hereby incorporated by reference in its entirety.

TECHNICAL FIELD

The present invention relates to a polishing pad and a method for producing a polished product.

BACKGROUND ART

Chemical mechanical polish-processing by polishing pads with polishing slurries is performed on surfaces (machining surfaces) of materials for semiconductor devices, electronic components and the like, in particular, thin substrates (workpieces) such as Si substrates (silicon wafers), substrates for hard discs, glass, and substrates for LCDs (liquid crystal displays).

Examples of known usage of polishing pads for use in such polish-processing include use of a polishing pad including a polishing layer having an E' ratio of about 1 to 3.6 at 30° C. to 90° C., in order to reduce dishing (Patent Literature 1) and use of a polishing pad including, in a polishing layer, a polymer material having a porosity of 0.1% by volume, a KEL energy loss coefficient of 385 to 750 1/Pa at 40° C. and 1 rad/sec, and an elastic modulus E' of 100 to 400 MPa at 40° C. and 1 rad/sec, in order that both planarization performance and a low defect performance rate are satisfied (Patent Literature 2).

CITATION LIST

Patent Literatures

Patent Literature 1: Japanese Translation of PCT International Application Publication No. 2004-507076
Patent Literature 2: Japanese Patent Laid-Open No. 2005-136400

SUMMARY OF INVENTION

Technical Problem

However, use of such polishing pad described in Patent Literatures 1 and 2 cannot be said to provide a high surface grade to the resulting workpiece, and has been found to cause, for example, generation of scratches.

The present invention has been made in view of the above problems, and an object thereof is to provide a polishing pad that can reduce generation of scratches, and a method for producing a polished product.

Solution to Problem

The present inventors have made intensive studies in order to solve the above problems, and as a result, have found that the above problems can be solved by using, as a polishing layer, a polyurethane sheet exhibiting values of storage elastic moduli within predetermined ranges, as obtained in dynamic viscoelasticity measurement performed with a tension mode and a bending mode, thereby leading to completion of the present invention.

That is, the present invention is as follows.

[1]

A polishing pad including a polyurethane sheet as a polishing layer, wherein the polyurethane sheet has a ratio ($E'_{B40}/E'_{T40}$) of a storage elastic modulus $E'_{B40}$ at 40° C. in dynamic viscoelasticity measurement performed under a bending mode condition with a frequency of 1.6 Hz to a storage elastic modulus $E'_{T40}$ at 40° C. in dynamic viscoelasticity measurement performed under a tension mode condition with a frequency of 1.6 Hz of 0.60 to 1.60.

[2]

The polishing pad according to [1], wherein the storage elastic modulus $E'_{B40}$ is $1.50\times10^8$ to $4.50\times10^8$ Pa.

[3]

The polishing pad according to [1] or [2], wherein the storage elastic modulus E'T40 is $1.50\times10^8$ to $4.50\times10^8$ Pa.

[4]

The polishing pad according to any one of [1] to [3], wherein the polyurethane sheet has a ratio ($E'_{B30}/E'_{B50}$) of a storage elastic modulus $E'_{B30}$ at 30° C. to a storage elastic modulus $E'_{B50}$ at 50° C. in dynamic viscoelasticity measurement performed under a bending mode condition with a frequency of 1.6 Hz of 1.00 to 2.60.

[5]

The polishing pad according to any one of [1] to [4], wherein the polyurethane sheet includes a polyurethane resin and a hollow fine particle dispersed in the polyurethane resin.

[6]

The polishing pad according to [5], wherein an average particle size of the hollow fine particle is 30 µm or less.

[7]

A method for producing a polished product, including a polishing step of polishing a workpiece in the presence of a polishing slurry by using the polishing pad according to any one of [1] to [6].

Advantageous Effect of Invention

The present invention can provide a polishing pad that can reduce generation of scratches, and a method for producing a polished product.

DESCRIPTION OF EMBODIMENTS

Figure 1:
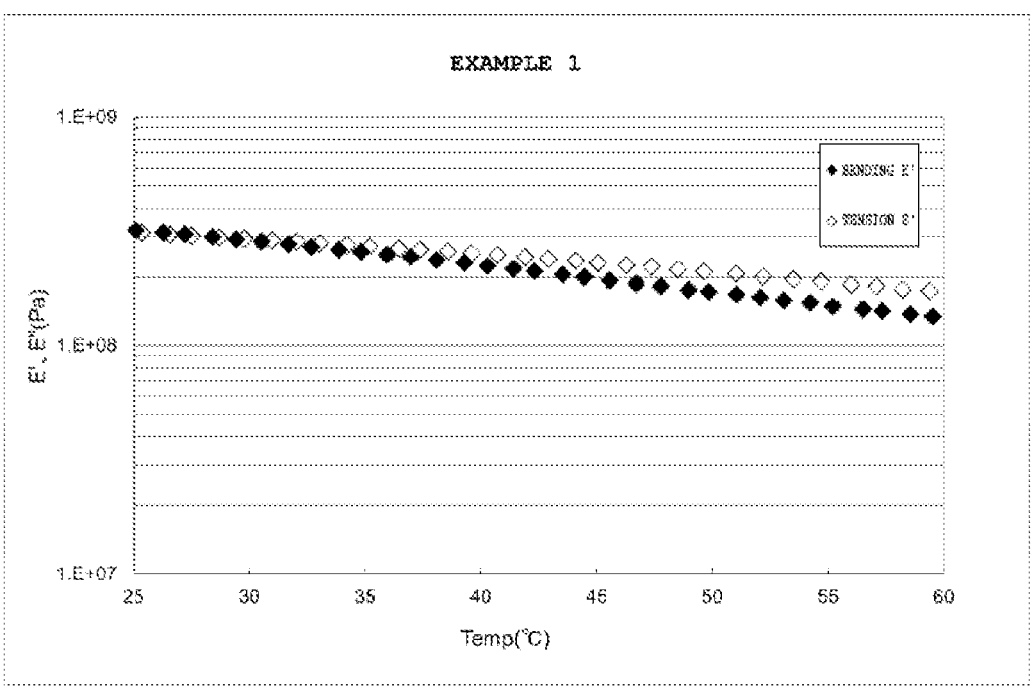
FIG. 1 is a diagram representing the results of dynamic viscoelasticity measurement in Example 1.

Hereinafter, embodiments of the present invention (hereinafter, referred to as "the present embodiment") will be described in detail, but the present invention is not limited thereto and can be variously modified without departing from the gist thereof.

Polishing Pad

The polishing pad of the present embodiment includes a polyurethane sheet as a polishing layer, wherein the polyurethane sheet has a ratio ($E'_{B40}/E'_{T40}$) of a storage elastic modulus $E'_{B40}$ at 40° C. in dynamic viscoelasticity measurement performed under a bending mode condition with a frequency of 1.6 Hz to a storage elastic modulus $E'_{T40}$ at 40° C. in dynamic viscoelasticity measurement performed under a tension mode condition with a frequency of 1.6 Hz of 0.60 to 1.60.

The storage elastic modulus E' corresponds to an index indicating an elastic component exhibited by a substance serving as a measurement object under measurement conditions. Before the workpiece is polished with a polishing pad, a dressing treatment for regulating flatness and surface roughness of a polishing surface is performed. The dressing treatment applies a force in the vertical direction of pressing a dresser against the polishing pad (dressing pressure) and a force in the horizontal direction of rubbing the dresser against the polishing pad (force in the rotating direction). A polishing step of contacting the workpiece and the polishing pad applies a force in the vertical direction of pressing the polishing pad against the workpiece (polishing pressure) and a force in the horizontal direction of rubbing the polishing pad against the workpiece (force in the rotating direction). In this time, the polishing pad to which these two forces are applied following the dresser or the workpiece in a certain degree can provide a polished product having excellent surface grade. Thus, the present embodiment prescribes the ratio of the obtained storage elastic moduli E' in dynamic viscoelasticity measurements with the tension mode and the bending mode to inhibit generation of scratches. Note that, the results of the dynamic viscoelasticity measurements with the tension mode and the bending mode, which may be said to be almost coincided, exhibit different behavior at least with the polishing pad.

From the above viewpoints, the present embodiment employs the ratio $(E'_{B40}/E'_{T40})$ of a storage elastic modulus $E'_{B40}$ at 40° C. in dynamic viscoelasticity measurement performed under a bending mode condition with a frequency of 1.6 Hz to a storage elastic modulus $E'_{T40}$ at 40° C. in dynamic viscoelasticity measurement performed under a tension mode condition with a frequency of 1.6 Hz as an index. The ratio $(E'_{B40}/E'_{T40})$ is 0.60 to 1.60, preferably 0.70 to 1.40, more preferably 0.75 to 1.20, and further preferably 0.80 to 1.00. The ratio $(E'_{B40}/E'_{T40})$ is within the above range, particularly the ratio $(E'_{B40}/E'_{T40})$ is 0.60 or more, and therefore the polishing pad more effectively follows the dresser with the forces in the vertical direction and horizontal direction to improve a state of the polishing surface, and generation of scratches can be inhibited. The reason therefor is not particularly limited, but it is presumed that the tensile storage elastic modulus corresponding to the force in the horizontal direction and the bending storage elastic modulus corresponding to the force in the vertical direction and following the workpiece surface are within the above ranges, and therefore the polishing pad more effectively and easily follows the dresser with the forces in the vertical direction and horizontal direction. The reason of inhibiting generation of scratches is not limited to the above.

$E'_{B40}$ is preferably $1.50 \times 10^8$ to $4.50 \times 10^8$ Pa, preferably $1.75 \times 10^8$ to $4.10 \times 10^8$ Pa, and preferably $2.00 \times 10^8$ to $3.70 \times 10^8$ Pa. With $E'_{B40}$ within the above range, the polishing pad more effectively follows the dresser with the force in the vertical direction to improve the state of the polishing surface, and generation of scratches is more likely to be inhibited.

$E'_{T40}$ is preferably $1.50 \times 10^8$ to $4.50 \times 10^8$ Pa, preferably $2.00 \times 10^8$ to $4.20 \times 10^8$ Pa, and preferably $2.30 \times 10^8$ to $3.90 \times 10^8$ Pa. With E'T40 within the above range, the polishing pad more effectively follows the dresser with the force in the horizontal direction to improve the state of the polishing surface, and generation of scratches is more likely to be inhibited.

Since a temperature of the polishing pad in the polishing step is approximately 40° C. in many cases, the present embodiment prescribes the ratio of the storage elastic moduli with the bending mode and tension mode at 40° C. In relation to this, the tendency of the storage elastic modulus with the bending mode may be further prescribed. Specifically, a ratio $(E'_{B30}/E'_{T50})$ of a storage elastic modulus $E'_{B30}$ at 30° C. to a storage elastic modulus $E'_{B50}$ at 50° C. in dynamic viscoelasticity measurement performed under a bending mode condition with a frequency of 1.6 Hz is preferably 1.00 to 2.60, more preferably 1.20 to 2.30, and further preferably 1.30 to 2.00. With the ratio $(E'_{B30}/E'_{B50})$ within the above range, a changing rate of the storage elastic modulus at 30 to 50° C. is small, and the ratio $(E'_{B40}/E'_{T40})$ of the storage elastic moduli with the bending mode and tension mode around 40° C. easily satisfy the predetermined range. Thus, in the polishing step, the polishing pad more effectively follows the dresser with the forces in the vertical direction and the horizontal direction to improve the state of the polishing surface, and generation of scratches is more likely to be inhibited.

$E'_{B30}$ is preferably $2.50 \times 10^8$ to $5.50 \times 10^8$ Pa, preferably $2.60 \times 10^8$ to $5.00 \times 10^8$ Pa, and preferably $2.70 \times 10^8$ to $4.50 \times 10^8$ Pa. $E'_{B50}$ is preferably $1.00 \times 10^8$ to $3.50 \times 10^8$ Pa, preferably $1.25 \times 10^8$ to $3.20 \times 10^8$ Pa, and preferably $1.50 \times 10^8$ to $2.90 \times 10^8$ Pa. With $E'_{B30}$ and/or $E'_{B50}$ within the above range, generation of scratches is more likely to be inhibited.

The dynamic viscoelasticity measurement in the present embodiment can be performed according to an ordinary method with the bending mode and the tension mode. Other conditions are not particularly limited, and such measurement can be made under conditions described in Examples.

Polyurethane Sheet

A polyurethane sheet is used in such any polishing layer having the above characteristics. The polyurethane resin constituting the polyurethane sheet is not particularly limited, and examples thereof include a polyester-based polyurethane resin, a polyether-based polyurethane resin and a polycarbonate-based polyurethane resin. The polyurethane resin is not particularly limited as long as the resin is a reaction product of a urethane prepolymer and a curing agent, and any of various known polyurethane resins can be applied. Such a resin may be used singly or in combinations of two or more kinds thereof.

Urethane Prepolymer

The urethane prepolymer is not particularly limited, and a reaction product of a polyisocyanate compound and a polyol compound, or commercially available urethane prepolymers can be appropriately used.

The polyisocyanate compound is not particularly limited as long as the polyisocyanate compound has two or more isocyanate groups in a molecule, and examples thereof include m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 4,4'-methylene-bis(cyclohexylisocyanate), 3,3'-dimethoxy-4,4'-biphenyl diisocyanate, 3,3'-dimethyldiphenyl-methane-4,4'-diisocyanate, xylylene-1, 4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,4-diisocyanate, p-phenylene diisothiocyanate, xylylene-1,4-diisothiocyanate, and ethylidyne diisothiocyanate.

In particular, 2,6-tolylene diisocyanate, 2,4-tolylene diisocyanate, and diphenylmethane-4,4'-diisocyanate are preferable, and 2,6-tolylene diisocyanate and 2,4-tolylene diisocyanate are more preferable. These polyisocyanate compounds may be used singly or in combinations of two or more thereof.

The polyol compound is not particularly limited as long as the polyol compound has two or more hydroxy groups in a molecule, and examples thereof include: diol compounds, such as ethylene glycol, diethylene glycol, and butylene glycol; triol compounds; polyether polyol compounds, such as polypropylene glycol and poly(oxytetramethylene) glycol; polyester polyol compounds such as a reaction product of ethylene glycol and adipic acid, and a reaction product of butylene glycol and adipic acid; polycarbonate polyol compounds and polycaprolactone polyol compounds; and tri-functional propylene glycols to which ethylene oxide is added.

In particular, poly(oxytetramethylene) glycol, polypropylene glycol, and diethylene glycol are preferable, and poly(oxytetramethylene) glycol is more preferable. These polyol compounds may be used singly or in combinations of two or more thereof.

For the polyol compound, high-molecular polyols such as poly(oxytetramethylene) glycol and polypropylene glycol, and low-molecular polyols such as diethylene glycol can be used in combination. A number average molecular weight of the high-molecular polyol is preferably 300 to 2000, more preferably 400 to 1750, and further preferably 500 to 1500. The high-molecular polyol may comprise two or more high-molecular polyols having different number average molecular weights.

The equivalent of NCO of the urethane prepolymer is preferably 300 to 700, more preferably 350 to 600, further preferably 400 to 500. Herein, the "equivalent of NCO" is determined according to "(Part(s) by mass of polyisocyanate compound+Part(s) by mass of polyol compound)/[(Number of functional groups per polyisocyanate compound molecule×Part(s) by mass of polyisocyanate compound/Molecular weight of polyisocyanate compound)−(Number of functional groups per polyol compound molecule×Part(s) by mass of polyol compound/Molecular weight of polyol compound)]", and corresponds to the numerical value representing the molecular weight per NCO group of the urethane prepolymer.

Curing Agent

The curing agent is not particularly limited, and examples thereof include polyvalent amine compounds and polyhydric alcohol compounds. One curing agent may be used singly or two or more thereof may be used in combination.

The polyvalent amine compound is not particularly limited, and examples thereof include ethylenediamine, propylenediamine, hexamethylenediamine, isophoronediamine, dicyclohexylmethane-4,4'-diamine, 3,3'-dichloro-4,4'-diaminodiphenylmethane (MOCA), 4-methyl-2,6-bis(methylthio)-1,3-benzenediamine, 2-methyl-4,6-bis(methylthio)-1,3-benzenediamine, 2,2-bis(3-amino-4-hydroxyphenyl)propane, 2,2-bis[3-(isopropylamino)-4-hydroxyphenyl]propane, 2,2-bis[3-(1-methylpropylamino)-4-hydroxyphenyl]propane, 2,2-bis[3-(1-methylpentylamino)-4-hydroxyphenyl]propane, 2,2-bis(3,5-diamino-4- hydroxyphenyl)propane, 2,6-diamino-4-methylphenol, trimethylethylenebis-4-aminobenzoate and polytetramethylene oxide-di-p-aminobenzoate.

The polyhydric alcohol compound is not particularly limited, and examples thereof include ethylene glycol, propylene glycol, diethylene glycol, trimethylene glycol, tetraethylene glycol, triethylene glycol, dipropylene glycol, 1,4-butanediol, 1,3-butanediol, 2,3-butanediol, 1,2-butanediol, 3-methyl-1,2-butanediol, 1,2-pentanediol, 1,4-pentanediol, 2,4-pentanediol, 2,3-dimethyltrimethylene glycol, tetramethylene glycol, 3-methyl-4,3-pentanediol, 3-methyl-4,5-pentanediol, 2,2,4-trimethyl-1,3-pentanediol, 1,6-hexanediol, 1,5-hexanediol, 1,4-hexanediol, 2,5-hexanediol, 1,4-cyclohexanedimethanol, neopentyl glycol, glycerin, trimethylolpropane, trimethylolethane, trimethylolmethane, poly(oxytetramethylene)glycol, polyethylene glycol and polypropylene glycol.

The polyvalent amine compound may have a hydroxyl group, and examples of such an amine-based compound can include 2-hydroxyethyl ethylenediamine, 2-hydroxyethyl propylenediamine, di-2-hydroxyethyl ethylenediamine, di-2-hydroxyethyl propylenediamine, 2-hydroxypropylethylenediamine and di-2-hydroxypropylethylenediamine.

In particular, the polyvalent amine compound is preferably a diamine compound, and more preferably 3,3'-dichloro-4,4'-diaminodiphenylmethane (MOCA). Examples of commercially available products of MOCA include PANDEX E (manufactured by DIC Corporation) and Iharacuamine MT (manufactured by Kumiai Chemical Industry Co., Ltd.). One curing agent may be used singly or two or more thereof may be used in combination.

An amount of the curing agent added is preferably 10 to 60 parts by mass, more preferably 20 to 50 parts by mass, and further preferably 20 to 40 parts by mass based on 100 parts by mass of the urethane prepolymer.

The storage elastic moduli with the bending mode and tension mode can be adjusted by the molecular weight (degree of polymerization) of the urethane prepolymer, and a combination of the urethane prepolymer and the curing agent. From these viewpoints, the R value, which is the equivalent ratio of active hydrogen groups (amino group and hydroxyl group) present in the curing agent to isocyanate groups present at a terminal of the isocyanate group-containing compound as the urethane prepolymer, can be used as an indicator, by way of example. The R value is preferably 0.70 to 1.30, more preferably 0.75 to 1.20, further preferably 0.80 to 1.10, still more preferably 0.80 to 1.00, and still further more preferably 0.85 to 0.95.

Cells

The polyurethane sheet is preferably a foamed polyurethane sheet having cells. Such cells of the foamed polyurethane sheet are classified to closed cells with a plurality of cells independently present and interconnected cells with a plurality of cells connected as communication holes. In particular, the polyurethane sheet in the present embodiment preferably has closed cells, and is more preferably a polyurethane sheet including a polyurethane resin and a hollow fine particle dispersed in the polyurethane resin. The hollow fine particle is used, thereby resulting in a tendency to facilitate adjustment of the storage elastic moduli with the bending mode and tension mode.

A polyurethane sheet having closed cells can be produced by using a hollow fine particle having an outer shell and being in a hollow state. Such a hollow fine particle here used may be a commercially available product or may be one obtained from being synthesized according to an ordinary method.

The material of the outer shell of the hollow fine particle is not particularly limited, and examples thereof include polyvinyl alcohol, polyvinylpyrrolidone, poly(meth)acrylic acid, polyacrylamide, polyethylene glycol, polyhydroxyetheracrylite, a maleic acid copolymer, polyethylene oxide, polyurethane, poly(meth)acrylonitrile, polyvinylidene chloride, polyvinyl chloride and an organic silicone-based resin, and a copolymer obtained by combining two or more monomers constituting such a resin. Examples of any hollow fine particle being a commercially available product include, but not limited to the following, Expancel series (trade name of Akzo Nobel N.V.) and Matsumoto Microsphere (trade name of Matsumoto Yushi-Seiyaku Co., Ltd.).

The shape of the hollow fine particle in the polyurethane sheet is not particularly limited, and may be, for example, a spherical shape or a substantially spherical shape. The average particle size of the hollow fine particle is preferably 30 μm or less, more preferably 25 μm or less, further preferably 20 μm or less, still more preferably 15 μm or less, and still further more preferably 10 μm or less. The average particle size of the hollow fine particle is preferably 1 μm or more, more preferably 2 μm or more, and further preferably 4 μm or more. The hollow fine particle can also be used to thereby adjust the storage elastic moduli with the bending mode and tension mode. The average particle size can be measured with, for example, a laser diffraction particle size distribution measurement apparatus (for example, Mastersizer-2000 manufactured by Spectris). With the average particle size of the hollow fine particle within the above range, an effect of size of cells formed with the hollow fine particle on the storage elastic moduli can be reduced, and the bending and tensile storage elastic moduli can be adjusted within the desired ranges. The average particle size in the present embodiment means a median diameter on a volumetric basis.

The hollow fine particle includes an expanded type in an already expanded state and an unexpanded type in an unexpanded state, and the unexpanded type is preferable. With the use of unexpanded-type hollow fine particle, cells with a small size formed in the polyurethane sheet are in a dispersed state, and the bending and tensile storage elastic moduli can be adjusted within the desired ranges.

The hollow fine particle is added so that the addition amount is preferably 0.1 to 10 parts by mass, more preferably 1 to 5 parts by mass, and further preferably 1 to 4 parts by mass based on 100 parts by mass of the urethane prepolymer. The storage elastic moduli with the bending mode and the tension mode can also be adjusted by adjusting the amount of the hollow fine particle added within the above range.

Other Components

A foaming agent conventionally used may be used in combination with the hollow fine particle, or any gas non-reactive with the respective components may be blown in the following mixing step, in addition to the above components, as long as the effects of the present invention are not impaired. Examples of the foaming agent include water and a foaming agent mainly containing a hydrocarbon having 5 or 6 carbon atoms. Examples of the hydrocarbon include chain hydrocarbons such as n-pentane and n-hexane, and alicyclic hydrocarbons such as cyclopentane and cyclohexane. For example, any known foam stabilizer, flame retardant, colorant, and/or plasticizer may also be added in addition to the above respective components.

Method for Producing Polyurethane Sheet

The method for producing the polyurethane sheet is not particularly limited, and examples thereof include a method having: a reacting step of reacting the urethane prepolymer and the curing agent in the presence of the hollow fine particle to obtain a polyurethane resin block; and a molding step of cutting a sheet from the obtained polyurethane resin block. Hereinafter, each step will be described in detail.

Reacting Step

In the reacting step, the urethane prepolymer and the curing agent are fed into a mixer and stirred and mixed to perform the reaction. In a case where the hollow fine particle is used, the urethane prepolymer, the curing agent and the hollow fine particle can be mixed to thereby provide a polyurethane resin block into which the hollow fine particle is incorporated. The order of mixing the respective components is not particularly limited, and preferably, the urethane prepolymer and the hollow fine particle are mixed in advance and the curing agent is fed thereto into a mixer.

In the present embodiment, a cell size in the polyurethane sheet and a size of the hollow fine particle, when used, are desirably reduced from the viewpoint of adjustment of the storage elastic moduli with the bending mode and tension mode. Thus, in the reaction between the urethane prepolymer and the curing agent, the mixing is preferably performed under conditions such that the hollow fine particle does not expand.

For example, such methods include a method involving: mixing the hollow fine particle and the urethane prepolymer in a first tank under a condition of relatively not applying heat; mixing the curing agent in a second liquid tank separately thereto; and subsequently adding and mixing the hollow fine particle and the urethane prepolymer in the first tank and the curing agent in the second tank into a mixer.

As a specific condition relatively not applying heat, a temperature of the first liquid tank is preferably 30 to 80° C., more preferably 35 to 70° C., and further preferably 40 to 65° C. This can inhibit expansion of the hollow fine particle.

Then, the mixed liquid prepared as above is poured into a mold preheated at 30 to 100° C., and heated and cured at approximately 100 to 150° C. for approximately 10 minutes to 5 hours to form the polyurethane resin block. In this time, the urethane prepolymer and the curing agent are reacted to cure the mixed liquid in a state where cells and/or the hollow fine particles are dispersed in the polyurethane resin. This forms the polyurethane resin block containing many cells having a substantially spherical shape.

Molding Step

The obtained polyurethane resin block is then sliced into a sheet to form the polyurethane sheet. This slicing provides apertures on the sheet surface. The resultant may be here aged at 30 to 150° C. for about 1 hour to 24 hours in order that an open hole which is excellent in wear resistance and which is hardly clogged is formed on a polishing layer surface.

A polishing layer having the polyurethane sheet thus obtained, where a double-sided tape is thereafter applied to a surface of the polishing layer, opposite to a polishing surface, is then cut to a predetermined shape, preferably a disc shape, and is finished as any polishing pad according to the present embodiment. The double-sided tape here used is not particularly limited, and can be arbitrarily selected from double-sided tapes known in the art.

Such any polishing pad according to the present embodiment may have a monolayer structure including only the polishing layer, or may include multiple layers of the polishing layer and other layer (lower layer, support layer) attached on a surface of the polishing layer, opposite to the polishing surface. Characteristics of such other layer are not particularly limited, and a layer more flexible than the polishing layer is attached on such an opposite surface of the polishing layer, thereby resulting in a further enhancement in polishing flatness. On the other hand, a layer more rigid than the polishing layer is attached on such an opposite surface of the polishing layer, thereby resulting in a further enhancement in polishing rate.

In the case of a multilayer structure, a plurality of layers may be bonded and fixed by using, for example, a double-sided tape or an adhesive, if necessary, under pressure. The double-sided tape or adhesive here used is not particularly limited, and may be arbitrarily selected from double-sided tapes or adhesives known in the art.

Furthermore, such any polishing pad according to the present embodiment, if necessary, may be subjected to a grinding treatment of a front surface and/or a rear surface of the polishing layer, grooving, embossing and/or hole drilling (punching) of the front surface, or attachment of a substrate and/or a pressure-sensitive adhesion layer to the polishing layer, or may include a light transmission portion. The method of the grinding treatment is not particularly limited, and such grinding can be made according to a known method. Specific examples thereof include grinding with sand paper. The shapes of such grooving and embossing are not particularly limited, and examples include lattice-like, concentric, and radial shapes.

Method for Producing Polished Product

Any method for producing a polished product according to the present embodiment includes a polishing step of polishing a workpiece in the presence of a polishing slurry by use of the polishing pad, thereby providing a polished product. The polishing step may be primary polishing (rough polishing) or final polishing, or both thereof. In particular, such any polishing pad according to the present embodiment is preferably used in chemical mechanical polishing. Hereinafter, any method for producing a polished product according to the present embodiment will be described with chemical mechanical polishing as an example, but such a method for producing a polished product according to the present embodiment is not limited to the following.

The production method involves not only feeding a polishing slurry, but also pushing a workpiece towards the polishing pad by use of a holding surface plate and simultaneously relatively rotating the holding surface plate and a polishing surface plate, thereby polish-processing a machining surface of the workpiece according to chemical mechanical polishing (CMP) with the polishing pad. The holding surface plate and the polishing surface plate may be rotated in the same direction or different directions at rotational speeds different from each other. The workpiece may also be subjected to polish-processing with being moved (in rotation) in a mold during polish-processing.

The polishing slurry may include water, a chemical component such as an oxidant typified by hydrogen peroxide, an additive, and/or an abrasive grain (polishing particle; for example, SiC, SiO$_2$, Al$_2$O$_3$, CeO$_2$), depending on, for example, the workpiece and polishing conditions.

The workpiece is not particularly limited, and examples thereof include materials for semiconductor devices, electronic components and the like, in particular, thin substrates (workpieces) such as a Si substrate (silicon wafer), a substrate for hard discs, and glass and a substrate for LCDs (liquid crystal displays). In particular, such a method for producing a polished product according to the present embodiment can be suitably used in a method for producing, for example, a semiconductor device in which an oxidation layer and a layer of a metal such as copper are formed.

EXAMPLES

Hereinafter, the present invention will be more specifically described with reference to Examples and Comparative Examples. The present invention is not limited to the following Examples at all.

Example 1

To 100 parts of a urethane prepolymer having an equivalent of NCO of 455 obtained by reacting 2,4-tolylene diisocyanate, poly(oxytetramethylene) glycol (number average molecular weight: 1000), poly(oxytetramethylene) glycol (number average molecular weight: 650), and diethylene glycol was added 2.7 parts of an unexpanded hollow fine particle including a shell portion made of an acrylonitrile-vinylidene chloride copolymer, incorporating an isobutane gas in the shell (average particle size: 8.5 μm), and the resultant was mixed, thereby providing a mixed liquid of the urethane prepolymer. The resulting mixed liquid of the urethane prepolymer was loaded into a first liquid tank, and the temperature was kept at 60° C. In addition, 25.8 parts of 3,3'-dichloro-4,4'-diaminodiphenylmethane (methylenebis-o-chloroaniline) (MOCA) as a curing agent was placed in a second liquid tank separately from the first liquid tank, mixed at 120° C., and furthermore defoamed under reduced pressure, thereby providing a molten liquid of the curing agent. To inhibit expansion of the hollow fine particle, the procedure temperatures were set as above.

Next, the respective liquids in the first liquid tank and the second liquid tank were poured into a mixer provided with two inlets, through such inlets, and stirred and mixed, thereby providing a mixed liquid. The mixing ratio thereof here was adjusted such that the R value was 0.90 which represented the equivalent ratio of an amino group and a hydroxyl group present in the curing agent relative to an isocyanate group present at a terminal in the urethane prepolymer.

The resulting mixed liquid was injected into a mold form pre-heated to 80° C., and primarily cured at 80° C. for 30 minutes. A molded product having a block shape, here formed, was extracted from the mold form, and secondarily cured in an oven at 120° C. for 4 hours, thereby providing a urethane resin block. The resulting urethane resin block was cooled to 25° C., and thereafter heated again in an oven at 120° C. for 5 hours and then subjected to a slicing treatment, thereby providing a foamed polyurethane sheet. A double-sided tape was applied onto a rear surface of the resulting polyurethane sheet, and the resultant was used as a polishing pad.

Comparative Example 1

A polishing pad (trade name: IC1000) manufactured by Nitta Haas Incorporated was prepared in Comparative Example 1.

Example 2

To 100 parts of a urethane prepolymer having an equivalent of NCO of 420 obtained by reacting 2,4-tolylene diisocyanate, poly(oxytetramethylene) glycol (number average molecular weight: 1000), poly(oxytetramethylene) glycol (number average molecular weight: 650), and diethylene glycol was added 2.5 parts of an unexpanded hollow fine particle including a shell portion made of an acrylonitrile-vinylidene chloride copolymer, incorporating an isobutane gas in the shell (average particle size: 8.5 μm), and the resultant was mixed, thereby providing a mixed liquid of the urethane prepolymer. The resulting mixed liquid of the urethane prepolymer was loaded into a first liquid tank, and the temperature was kept at 60° C. In addition, 28.3 parts of 3,3'-dichloro-4,4'-diaminodiphenylmethane (methylenebis-o-chloroaniline) (MOCA) as a curing agent was placed in a second liquid tank separately from the first liquid tank, mixed at 120° C., and furthermore defoamed under reduced pressure, thereby providing a molten liquid of the curing agent. To inhibit expansion of the hollow fine particle, the procedure temperatures were set as above. The same procedure was performed as in Example 1 except for the above to produce a polishing pad of Example 2.

Example 3

To 100 parts of a urethane prepolymer having an equivalent of NCO of 420 obtained by reacting 2,4-tolylene diisocyanate, poly(oxytetramethylene) glycol (number average molecular weight: 1000), poly(oxytetramethylene) glycol (number average molecular weight: 650), and diethylene glycol was added 4.9 parts of an unexpanded hollow fine particle including a shell portion made of an acrylonitrile-vinylidene chloride copolymer, incorporating an isobutane gas in the shell (average particle size: 5.3 μm), and the resultant was mixed, thereby providing a mixed liquid of the urethane prepolymer. The resulting mixed liquid of the urethane prepolymer was loaded into a first liquid tank, and the temperature was kept at 60° C. In addition, 27.8 parts of 3,3'-dichloro-4,4'-diaminodiphenylmethane (methylenebis-o-chloroaniline) (MOCA) as a curing agent was placed in a second liquid tank separately from the first liquid tank, mixed at 120° C., and furthermore defoamed under reduced pressure, thereby providing a molten liquid of the curing agent. To inhibit expansion of the hollow fine particle, the procedure temperatures were set as above. The same procedure was performed as in Example 1 except for the above to produce a polishing pad of Example 3.

Example 4

To 100 parts of a urethane prepolymer having an equivalent of NCO of 420 obtained by reacting 2,4-tolylene diisocyanate, poly(oxytetramethylene) glycol (number average molecular weight: 650), and diethylene glycol was added 2.8 parts of an unexpanded hollow fine particle including a shell portion made of an acrylonitrile-vinylidene chloride copolymer, incorporating an isobutane gas in the shell (average particle size: 6.9 μm), and the resultant was mixed, thereby providing a mixed liquid of the urethane prepolymer. The resulting mixed liquid of the urethane prepolymer was loaded into a first liquid tank, and the temperature was kept at 60° C. In addition, 28.1 parts of 3,3'-dichloro-4,4'-diaminodiphenylmethane (methylenebis-o-chloroaniline) (MOCA) as a curing agent was placed in a second liquid tank separately from the first liquid tank, mixed at 120° C., and furthermore defoamed under reduced pressure, thereby providing a molten liquid of the curing agent. To inhibit expansion of the hollow fine particle, the procedure temperatures were set as above. The same procedure was performed as in Example 1 except for the above to produce a polishing pad of Example 4.

Example 5

To 100 parts of a urethane prepolymer having an equivalent of NCO of 440 obtained by reacting 2,4-tolylene diisocyanate, poly(oxytetramethylene) glycol (number average molecular weight: 650), and diethylene glycol was added 2.9 parts of an unexpanded hollow fine particle including a shell portion made of an acrylonitrile-vinylidene chloride copolymer, incorporating an isobutane gas in the shell (average particle size: 6.9 μm), and the resultant was mixed, thereby providing a mixed liquid of the urethane prepolymer. The resulting mixed liquid of the urethane prepolymer was loaded into a first liquid tank, and the temperature was kept at 60° C. In addition, 26.7 parts of 3,3'-dichloro-4,4'-diaminodiphenylmethane (methylenebis-o-chloroaniline) (MOCA) as a curing agent was placed in a second liquid tank separately from the first liquid tank, mixed at 120° C., and furthermore defoamed under reduced pressure, thereby providing a molten liquid of the curing agent. To inhibit expansion of the hollow fine particle, the procedure temperatures were set as above. The same procedure was performed as in Example 1 except for the above to produce a polishing pad of Example 5.

Example 6

To 100 parts of a urethane prepolymer having an equivalent of NCO of 500 obtained by reacting 2,4-tolylene diisocyanate, polypropylene glycol (number average molecular weight: 100), and diethylene glycol was added 2.5 parts of an unexpanded hollow fine particle including a shell portion made of an acrylonitrile-vinylidene chloride copolymer, incorporating an isobutane gas in the shell (average particle size: 20 μm), and the resultant was mixed, thereby providing a mixed liquid of the urethane prepolymer. The resulting mixed liquid of the urethane prepolymer was loaded into a first liquid tank, and the temperature was kept at 60° C. In addition, 23.1 parts of 3,3'-dichloro-4,4'-diaminodiphenylmethane (methylenebis-o-chloroaniline) (MOCA) as a curing agent was placed in a second liquid tank separately from the first liquid tank, mixed at 120° C., and furthermore defoamed under reduced pressure, thereby providing a molten liquid of the curing agent. The same procedure was performed as in Example 1 except for the above to produce a polishing pad of Example 6.

Dynamic Viscoelasticity Measurement

Tension Mode

Each of the polyurethane sheets was subjected to dynamic viscoelasticity measurement under the following conditions. A polyurethane sheet in a dry state, obtained by retaining a polyurethane sheet in a thermohygrostat bath at a temperature of 23° C. (±2° C.) and a relative humidity of 50% (±5%) for 40 hours, was used as a sample, and subjected to dynamic viscoelasticity measurement under a usual air atmosphere (dry state) with a tension mode. The measurement conditions with the tension mode are described below.

Measurement Conditions

Measurement apparatus: RSA3 (manufactured by TA Instruments)
Sample: 4 cm in length×0.5 cm in width×0.125 cm in thickness
Test length: 1 cm
Pre-treatment of sample: retained at a temperature of 23° C. and a relative humidity of 50% for 40 hours
Test mode: tension
Frequency: 1.6 Hz (10 rad/sec)
Temperature range: 25 to 60° C.
Rate of temperature rise: 1.5° C./min
Strain range: 0.10%
Initial load: 148 g
Measurement interval: 2 point/° C.

Bending Mode

The similar sample was subjected to dynamic viscoelasticity measurement with a bending mode. The measurement conditions with the bending mode are described below.

Measurement Conditions

Measurement apparatus: RSA3 (manufactured by TA Instruments)

having an acrylic adhesive being interposed therebetween, and a Cu film substrate was subjected to polish-processing under the following conditions.

Polishing Conditions

Polishing machine: F-REX300 (manufactured by Ebara Corporation)
Disk: A188 (manufactured by 3M)
Number of rotations: (surface plate) 70 rpm, (top ring) 71 rpm
Polishing pressure: 3.5 psi
Temperature of polishing agent: 20° C.
Amount of polishing agent discharged: 200 ml/min
Polishing agent: PLANERLITE 7000 (manufactured by Fujimi Incorporated)
Workpiece: Cu film substrate
Polishing time: 60 seconds
Pad brake: 35 N 10 minutes
Conditioning: Ex-situ, 35 N, 4 scanning Any point-like polishing flaw (micro scratch) having a size of more than 155 nm was visually confirmed on a polished surface with respect to each workpiece from the eleventh object to the fifty-first object after the polish-processing, with Review SEM of eDR5210 (manufactured by KLA Corporation), and the average value was obtained. The surface grade was rated based on the result of such scratch confirmation.

TABLE 1

| | | | Example 1 | Comparative Example 1 | Example 2 | Example 3 | Example 4 | Example 5 | Example 6 |
|---|---|---|---|---|---|---|---|---|---|
| Bending mode | Storage elastic modulus [Pa] | $E'_{B30}$ | 2.93E+08 | 2.43E+08 | 4.17E+08 | 4.13E+08 | 3.53E+08 | 4.26E+08 | 2.63E+08 |
| | | $E'_{B40}$ | 2.23E+08 | 1.53E+08 | 3.32E+08 | 3.39E+08 | 2.73E+08 | 3.2E+08 | 1.61E+08 |
| | | $E'_{B50}$ | 1.72E+08 | 9.00E+07 | 2.63E+08 | 2.71E+08 | 2.12E+08 | 2.33E+08 | 1.02E+08 |
| Tension mode | Storage elastic modulus [Pa] | $E'_{T40}$ | 2.54E+08 | 2.92E+08 | 3.81E+08 | 3.82E+08 | 3.15E+08 | 3.35E+08 | 1.66E+08 |
| | Ratio ($E'_{B30}/E'_{B50}$) | | 1.70 | 2.70 | 1.58 | 1.52 | 1.67 | 1.83 | 2.57 |
| | Ratio ($E'_{B40}/E'_{T40}$) | | 0.88 | 0.52 | 0.87 | 0.89 | 0.87 | 0.96 | 0.97 |
| | Scratch evaluation | | 4 | 9 | 5 | 3 | 4 | 3 | 3 |

Figure 2:
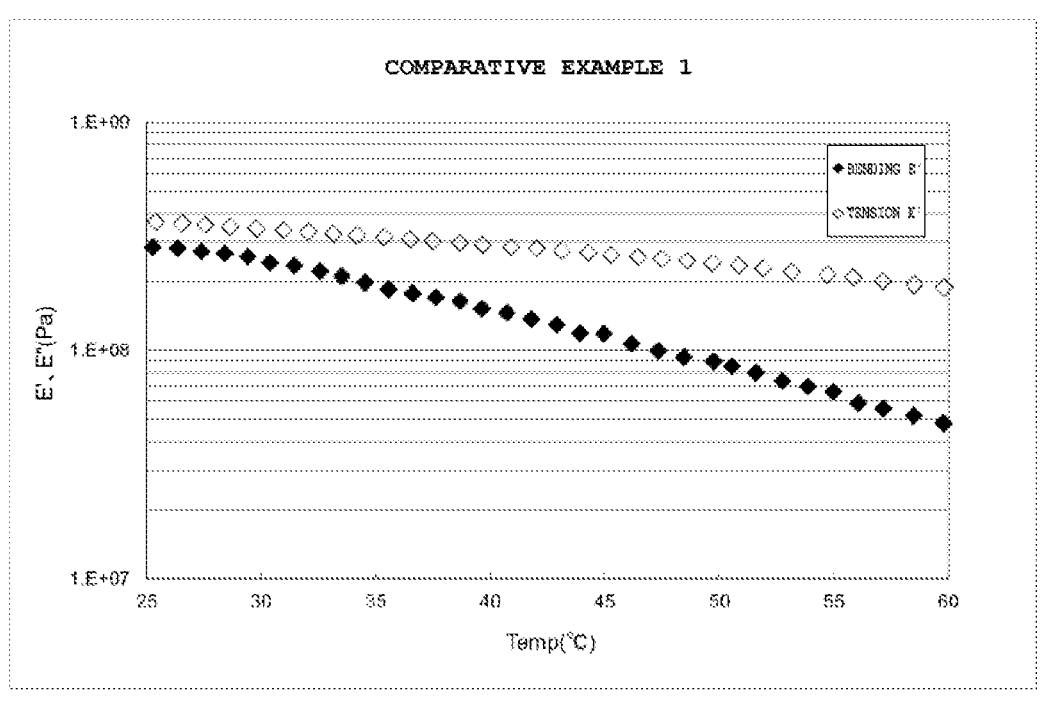
FIG. 2 is a diagram representing the results of dynamic viscoelasticity measurement in Comparative Example 1.

Sample: 5 cm in length×0.5 cm in width×0.125 cm in thickness
Test length: —
Pre-treatment of sample: retained at a temperature of 23° C. and a relative humidity of 50% for 40 hours
Test mode: bending
Frequency: 1.6 Hz (10 rad/sec)
Temperature range: 25 to 60° C.
Rate of temperature rise: 1.5° C./min
Strain range: 0.10%
Initial load: —
Measurement interval: 2 point/° C.
FIG. 1 and FIG. 2 show plots of the storage elastic moduli with the tension mode and the bending mode in Example 1 and Comparative Example 1.
[Test for Confirming Surface Grade]
Each of the polishing pads was placed at a predetermined location of a polishing apparatus with a double-sided tape

INDUSTRIAL APPLICABILITY

The polishing pad of the present invention is used for polishing, for example, an optical material, a semiconductor device, and a substrate for hard discs, and has industrial applicability particularly as a polishing pad suitably used for polishing a device where an oxide layer, a layer of a metal such as copper, and the like are formed on a semiconductor wafer.

The invention claimed is:
1. A polishing pad comprising a polyurethane sheet as a polishing layer,
  wherein the polyurethane sheet has a ratio ($E'_{B40}/E'_{T40}$) of a storage elastic modulus $E'_{B40}$ at 40° C. in dynamic viscoelasticity measurement performed under a bending mode condition with a frequency of 1.6 Hz to a storage elastic modulus $E'_{T40}$ at 40° C. in dynamic viscoelasticity measurement performed under a tension mode condition with a frequency of 1.6 Hz of 0.60 to 1.60.

2. The polishing pad according to claim 1, wherein the storage elastic modulus $E'_{B40}$ is $1.50 \times 10^8$ to $4.50 \times 10^8$ Pa.

3. The polishing pad according to claim 1 or 2, wherein the storage elastic modulus E'T40 is 1.50×108 to 4.50×108 Pa.

4. The polishing pad according to claim 1, wherein the polyurethane sheet has a ratio $(E'_{B30}/E'_{B50})$ of a storage elastic modulus $E'_{B30}$ at 30° C. to a storage elastic modulus $E'_{B50}$ at 50° C. in dynamic viscoelasticity measurement performed under a bending mode condition with a frequency of 1.6 Hz of 1.00 to 2.60.

5. The polishing pad according to claim 1, wherein the polyurethane sheet comprises a polyurethane resin and a hollow fine particle dispersed in the polyurethane resin.

6. The polishing pad according to claim 5, wherein an average particle size of the hollow fine particle is 30 μm or less.

7. A method for producing a polished product, comprising a polishing step of polishing a workpiece in the presence of a polishing slurry by use of the polishing pad according to claim 1.

* * * * *